United States Patent
Fujita et al.

(10) Patent No.: US 11,731,230 B2
(45) Date of Patent: Aug. 22, 2023

(54) METHOD FOR MANUFACTURING SPUTTERING TARGET AND SPUTTERING TARGET

(71) Applicant: SUMITOMO CHEMICAL COMPANY, LIMITED, Tokyo (JP)

(72) Inventors: Masahiro Fujita, Niihama (JP); Koji Nishioka, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 230 days.

(21) Appl. No.: 16/332,206

(22) PCT Filed: Sep. 21, 2018

(86) PCT No.: PCT/JP2018/035005
§ 371 (c)(1),
(2) Date: Mar. 11, 2019

(87) PCT Pub. No.: WO2019/069713
PCT Pub. Date: Apr. 11, 2019

(65) Prior Publication Data
US 2020/0384598 A1 Dec. 10, 2020

(30) Foreign Application Priority Data

Oct. 2, 2017 (JP) ................................. 2017-192892
Mar. 23, 2018 (JP) ................................. 2018-056504

(51) Int. Cl.
*C23C 14/34* (2006.01)
*B24B 29/02* (2006.01)
*B24B 1/00* (2006.01)
*C23C 14/02* (2006.01)

(52) U.S. Cl.
CPC ................ *B24B 29/02* (2013.01); *B24B 1/00* (2013.01); *C23C 14/028* (2013.01); *C23C 14/3414* (2013.01)

(58) Field of Classification Search
CPC .. H01J 37/3414; C23C 14/3414; C23C 14/14; C23C 14/028; B24B 1/00; B24B 29/02
(Continued)

(56) References Cited

U.S. PATENT DOCUMENTS

| 2007/0215463 A1* | 9/2007 | Parkhe | ................ C23C 14/3414 |
| | | | 204/298.12 |
| 2012/0003486 A1* | 1/2012 | Rozak | .................... C22C 27/04 |
| | | | 428/457 |

(Continued)

FOREIGN PATENT DOCUMENTS

| CN | 106312565 A | 1/2017 |
| CN | 106346344 A | 1/2017 |

(Continued)

OTHER PUBLICATIONS

Machine translation to Takagi (JP 2011-127189) published Oct. 2011. (Year: 2011).*

(Continued)

*Primary Examiner* — Rodney G McDonald
(74) *Attorney, Agent, or Firm* — Birch, Stewart, Kolasch & Birch, LLP

(57) ABSTRACT

A sputtering target that is less likely to cause abnormal discharge is manufactured. A method for manufacturing a sputtering target includes performing multi-stage polishing on a sputtering surface of a target material having a Vickers hardness of 100 or less being made of metal by using a plurality of abrasives having different grit numbers in ascending order of grit number from a small grit number to a large grit number.

6 Claims, 1 Drawing Sheet

(58) Field of Classification Search
USPC .................................................. 204/298.12
See application file for complete search history.

(56) References Cited

U.S. PATENT DOCUMENTS

| | | | | |
|---|---|---|---|---|
| 2014/0311900 | A1* | 10/2014 | Yuan | H01J 37/3435 204/298.13 |
| 2016/0064200 | A1* | 3/2016 | Taketomi | C04B 37/026 204/298.13 |
| 2016/0343554 | A1 | 11/2016 | Tomai et al. | |
| 2017/0294203 | A1* | 10/2017 | Ogino | C22C 1/1084 |

FOREIGN PATENT DOCUMENTS

| | | | |
|---|---|---|---|
| JP | 07108464 A | * | 4/1995 |
| JP | 9-174394 A | | 7/1997 |
| JP | 11-189836 A | | 7/1999 |
| JP | 2001-316808 A | | 11/2001 |
| JP | 2002-45663 A | | 2/2002 |
| JP | 2011-127189 A | | 6/2011 |
| JP | 2011-252223 A | | 12/2011 |
| JP | 2012-176452 A | | 9/2012 |
| JP | 2014-218706 A | | 11/2014 |

OTHER PUBLICATIONS

Chinese Office Action dated Sep. 3, 2019, for Chinese Application No. 201880003495.X, with English translation.
Japanese Notice of Reasons for Refusal dated May 29, 2018, for Japanese Application No. 2018-056504, with English translation.
Korean Office Action dated Aug. 1, 2019, for Korean Application No. 10-2019-7007680, with English translation.
Taiwanese Office Action and Search Report dated Sep. 20, 2019, for Taiwanese Application No. 107133941, with English translation.

* cited by examiner

METHOD FOR MANUFACTURING SPUTTERING TARGET AND SPUTTERING TARGET

TECHNICAL FIELD

The present invention relates to a method for manufacturing a sputtering target and a sputtering target.

BACKGROUND ART

In recent years, sputtering has been used as a method of enabling uniform film deposition over a large area. The sputtering has become the mainstream of fabricating thin films constituting liquid crystal displays, organic EL displays, etc., as well as wiring films in the optical recording field and the semiconductor field, and the like. In the sputtering, a material processed into a plate shape or disk shape, which is called a sputtering target, is used.

Conventionally, the sputtering target has been manufactured by forming a material for formation of a thin film into a plate shape and bonding the plate-shaped material to a metal plate, called a backing plate, through heating. This step is referred to as a bonding step and mentioned in, for example, JP 2011-252223 A (Patent Document 1).

PRIOR ART DOCUMENT

Patent Document

Patent Document 1: JP 2011-252223 A

DISCLOSURE OF THE INVENTION

Problems to be Solved by the Invention

In the target material bonded under heating conditions, such as those in the related art, a thick oxidized layer may be formed on a surface of the target material in some cases. Polishing can be proposed as a method of removing or reducing the oxidized layer, but it has been found that a target material from which the oxidized layer is actually removed by polishing has large irregularities on its surface, which may cause abnormal discharge during sputtering.

The present invention has been made to solve the foregoing problems, and it is an object of the present invention to provide a sputtering target which is less likely to cause abnormal discharge.

Means for Solving the Problems

In order to solve the above-mentioned problems, a method for manufacturing a sputtering target according to the present invention includes performing multi-stage polishing on a sputtering surface of a target material having a Vickers hardness (HV) of 100 or less made of metal by using a plurality of abrasives having different grit numbers (grain sizes) in ascending order of grit number from a small grit number to a large grit number.

According to the manufacturing method of the present invention, the sputtering target is manufactured in a way that includes performing multi-stage polishing on the sputtering surface of the target material having the HV of 100 or less, which is made of metal, by using the plurality of abrasives having the different grit numbers. Thus, surface irregularities on the sputtering surface of the target material can be reduced, whereby the sputtering target which is less likely to cause abnormal discharge can be obtained in a short time.

In the method for manufacturing a sputtering target of an embodiment, in two sequential stages of the multi-stage polishing, a grit number of an abrasive used in the latter stage is more than 1.0 time and less than 2.5 times larger than a grit number of an abrasive used in the former stage.

According to the manufacturing method of the above-mentioned embodiment, in the two sequential stages of the multi-stage polishing, the grit number of the abrasive used in the latter stage is more than 1.0 time and less than 2.5 times larger than the grit number of the abrasive used in the former stage, so that surface irregularities can be effectively reduced in the latter stage from the surface which is in the state after the end of the former stage. Furthermore, according to the manufacturing method of the above-mentioned embodiment, variations (standard deviation) in surface irregularities can also be effectively reduced in the latter stage from the surface which is in the state after the end of the former stage.

In the method for manufacturing a sputtering target of another embodiment, a grit number of an abrasive used in the last stage of the multi-stage polishing is 1.7 times or less larger than a grit number of an abrasive used in a stage immediately preceding the last stage.

According to the manufacturing method of the above-mentioned embodiment, since the grit number of the abrasive used in the last stage of the multi-stage polishing is 1.7 times or less larger than the grit number of the abrasive used in the stage immediately preceding the last stage, surface irregularities can be effectively reduced in the last stage from the surface which is in the state after the end of the stage immediately preceding the last stage. Furthermore, according to the manufacturing method of the above-mentioned embodiment, variations (standard deviation) in surface irregularities can also be effectively reduced in the last stage from the surface which is in the state after the end of the stage immediately preceding the last stage.

In the method for manufacturing a sputtering target of another embodiment, a grit number of an abrasive used in the first stage of the multi-stage polishing is more than #320.

According to the manufacturing method of the above-mentioned embodiment, since the grit number of the abrasive used in the first stage of the multi-stage polishing is more than #320, an oxidized layer formed on the surface of the target material during a bonding process can be removed without drastically increasing surface irregularities on the surface of the target material and also without damaging the surface of the target material. Consequently, the surface irregularities can be effectively reduced by the abrasive used in the subsequent stage.

In the method for manufacturing a sputtering target of another embodiment, a grit number of an abrasive used in the last stage of the multi-stage polishing is #800 or more and #1500 or less.

According to the manufacturing method of the above-mentioned embodiment, since the grit number of the abrasive used in the last stage of the multi-stage polishing is #800 or more and #1500 or less, surface irregularities on the surface of the target material can be reduced, thereby effectively suppressing the occurrence of abnormal discharge in the manufactured sputtering target. In addition, according to the manufacturing method of the above-mentioned embodiment, the grit number of the abrasive used in the last stage is sufficiently large, thereby also making it possible to effectively reduce variations (standard deviation) in surface irregularities.

In the method for manufacturing a sputtering target of another embodiment, the metal forming the target material is Al or an Al alloy.

According to the manufacturing method of the above-mentioned embodiment, the sputtering target can be provided which includes the target material made of Al or an Al alloy and from which surface irregularities are effectively reduced.

In the method for manufacturing a sputtering target of another embodiment, the metal forming the target material is Cu or a Cu alloy.

According to the manufacturing method of the above-mentioned embodiment, the sputtering target can be provided which includes the target material made of Cu or a Cu alloy and from which surface irregularities are effectively reduced.

A sputtering target of one embodiment, provided by the method for manufacturing a sputtering target, comprises a target material made of metal, wherein an average of arithmetic average roughness Ra measured at a plurality of measurement points on the sputtering surface of the target material is 0.5 μm or less, and a standard deviation σ of the arithmetic average roughness Ra measured at the plurality of measurement points thereon is 0.1 μm or less.

Since in the above-mentioned sputtering target, the average of arithmetic average roughness Ra measured at the plurality of measurement points on the sputtering surface of the target material is 0.5 μm or less, and the standard deviation σ of the arithmetic average roughness Ra measured at the plurality of measurement points thereon is 0.1 μm or less, surface irregularities on the sputtering surface and variations thereof can be reduced, thus effectively suppressing the occurrence of abnormal discharge.

Effects of the Invention

According to the present invention, the sputtering target that is less likely to cause abnormal discharge can be provided.

MODE FOR CARRYING OUT THE INVENTION

In view of the above-mentioned problems, the inventors of the present application have considered the reason why abnormal discharge would be caused by the sputtering target from which an oxidized layer is removed by polishing. Consequently, it has become clear that when the hardness of the target material is not sufficiently high (its Vickers hardness (HV) is 100 or less), the polishing of the target material using an abrasive having large abrasive grains (a small grit number) to remove the oxidized layer may generate large surface irregularities, which would cause abnormal discharge on the surface of the target material. Moreover, the surface irregularities cannot be completely removed even after a huge time is taken therefor. Eventually, such surface irregularities cause abnormal discharge. On the other hand, when an attempt was made to remove and reduce the oxidized layer by using an abrasive of fine abrasive grains (a large grit number), it took an enormous period of time to remove the thick oxidized layer. In the technical field to which the present invention belongs, the size of the abrasive grains used in the abrasive is represented by a number that is denoted as a grit number. The larger the grit number, the smaller the size of the abrasive grain becomes, whereas the smaller the grit number, the larger the size of the abrasive grain becomes.

Due to this, the inventors of the present application have searched for a method capable of solving the problem of difficulty in providing a sputtering target that is less likely to cause abnormal discharge, while removing or reducing an oxidized layer from a target material which does not have sufficient hardness. As a result, it has been found that this problem can be solved by using a method that involves performing multi-stage polishing on the target material with abrasives in ascending order of grit number from the small grit number to the large grit number.

The present invention will be described in detail below with reference to embodiments shown in the accompanying drawings.

Figure 1:
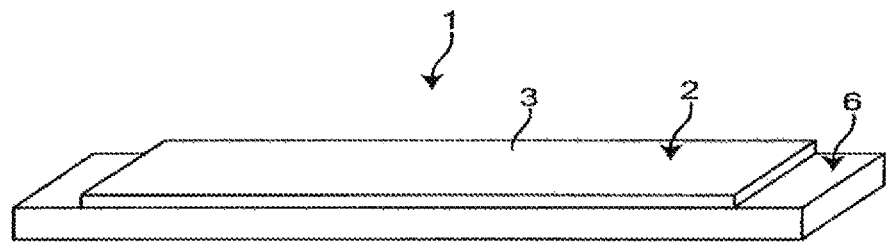
FIG. 1 is a perspective view from above of a sputtering target according to an embodiment of the present invention.
Figure 2A:
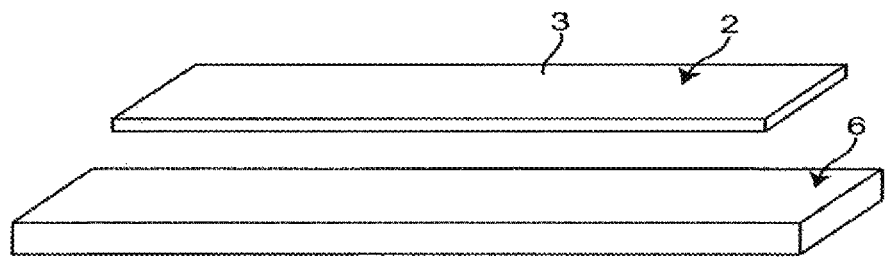
FIG. 2A is an explanatory diagram for explaining a method for manufacturing a sputtering target.
Figure 2B:
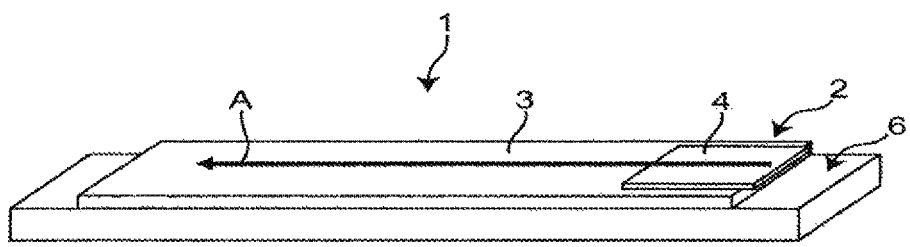
FIG. 2B is an explanatory diagram for explaining the method for manufacturing a sputtering target.
Figure 3:
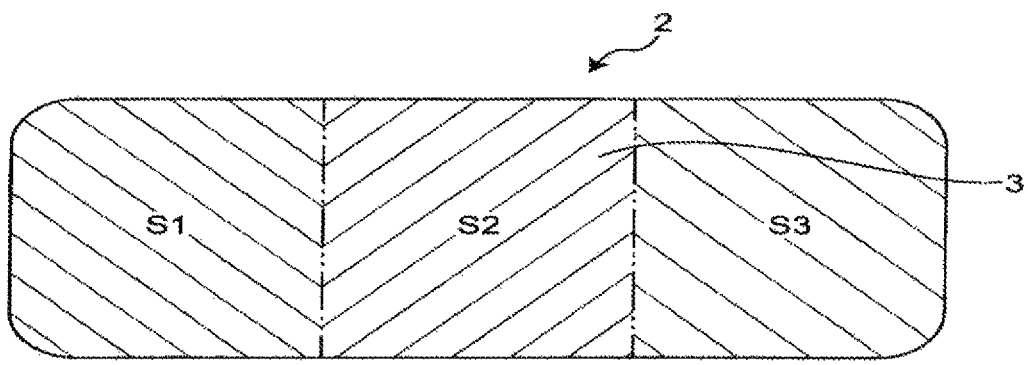
FIG. 3 is a schematic plan view showing a sputtering surface that is imaginarily divided for convenience in calculating a plurality of arithmetic average roughness Ra of the sputtering surface.

FIG. 1 is a perspective view from above of a sputtering target according to an embodiment of the present invention. FIGS. 2A and 2B are explanatory diagrams for explaining a method for manufacturing the sputtering target. FIG. 3 is a schematic plan view showing a sputtering surface that is imaginarily divided for convenience in calculating a plurality of arithmetic average roughness Ra of the sputtering surface.

As shown in FIG. 1, a sputtering target 1 of the present invention includes a target material 2 and a backing plate 6 joined to a lower surface of the target material 2. The target material 2 is formed in an elongated plate shape. A sputtering surface 3 is constituted of an upper surface defined by a short side direction and a long side direction. The size of the target material 2 is not particularly limited. Specifically, the length in the short side direction of the target material 2 is, for example, 100 mm to 2,000 mm, preferably 150 mm to 1,500 mm, and more preferably 200 mm to 1,000 mm. The length in the long side direction of the target material 2 is, for example, 100 mm to 4,000 mm, preferably 300 mm to 3,500 mm, and more preferably 450 mm to 3,000 mm. It is noted that the length in the long side direction of the target material 2 and the length in the short side direction thereof may be the same or different from each other. The length of each of the short and long sides of the backing plate 6 is not particularly limited. The short and/or long side of the backing plate 6 may be longer than the corresponding side of the target material 2, or alternatively may have the same length as the corresponding side of the target material 2, as is the case with the respective short sides of the backing plate 6 and the target material 2 shown in FIG. 1. The backing plate 6 may also be formed in an elongated plate shape that has an upper surface constituted of the short side and the long side which are slightly shorter than the short side and the long side of the target material 2, respectively. In particular, in a large-sized target material for a flat panel display that has a length of 1,000 mm to 3,500 mm in the long side direction and a length of 180 mm to 1,900 mm in the short side direction, it is very difficult to reduce surface irregularities and their variations (standard deviation). Therefore, the present invention can be suitably applied to such a target material.

It is noted that the sputtering target 1 may be formed in a disk shape. At this time, the target material 2 is also formed in a disk shape. When the target material 2 is formed in the disk shape, its size is not particularly limited, and its diameter may be, for example, 100 mm to 600 mm, preferably 250 mm to 500 mm, and more preferably 300 mm to 450 mm. The backing plate 6 can be formed in a disk shape, including a circular upper surface that has a diameter equal to, larger, or slightly smaller than an upper surface of the target material 2. The sputtering surface 3 has a circular shape.

In other embodiments, the sputtering target has a cylindrical shape and includes a cylindrical target material and a cylindrical backing tube which is inserted into the target material. Alternatively, the sputtering target includes a cylindrical target material and flanges, cap materials, or adapter materials that are attached to both ends of the target material. In the case of the cylindrical target, an outer peripheral portion of the cylinder serves as a sputtering surface. When the sputtering target is formed in the cylindrical shape, the size of the target material is not particularly limited, and its length in the axial direction may be, for example, 500 mm to 4,000 mm, preferably 1,000 mm to 3,600 mm, more preferably 2,000 mm to 3,000 mm, and still more preferably 2,200 mm to 2,700 mm. The inner diameter of the target material may be from 70 mm to 250 mm, preferably from 100 mm to 200 mm, and more preferably from 110 mm to 150 mm, whereas the outer diameter of the target material may be from 120 mm to 300 mm, preferably from 150 mm to 190 mm, and more preferably from 160 mm to 175 mm. In particular, in a large-sized target material for a flat panel display that has a length of 1,700 mm to 3,500 mm in an axial direction, it is difficult to reduce surface irregularities and their variations (standard deviation). Therefore, the present invention can be suitably applied to such a target material.

During the sputtering, an ionized inert gas collides with the sputtering surface 3 of the target material 2. Target atoms contained in the target material 2 are sputtered and ejected from the sputtering surface 3 with which the ionized inert gas collides. The sputtered atoms are deposited on a substrate facing the sputtering surface 3 to thereby form a thin film on the substrate. If irregularities on the surface are large, uneven distribution of electric charges tends to occur especially on the tip end of a bump on the surface during the sputtering, making it more likely to cause abnormal discharge. If variations in surface roughness are large, a part of the sputtering surface 3 of the target material 2 may have large irregularities, and for this reason, abnormal discharge is more likely to occur there. Particularly, in a metal having a low melting point, this abnormal discharge becomes a more remarkable problem because the occurrence of the abnormal discharge causes "splash", in which the target material molten from the target surface is ejected out and particles of the target material with a size of several pm adhere to a substrate. However, the sputtering surface 3 of the target material 2 proposed in the present application is a surface (polished surface) subjected to the polishing, and thus tends to have bumps with their sharp tip ends while large surface irregularities are concurrently removed therefrom, as compared to a case where an oxidized layer is removed from the spattering surface by blasting or etching with acid and alkali. Consequently, fine irregularities remain on the sputtering surface 3, which enables stable sputtering when a high voltage is applied or in the initial stage of sputtering.

Next, a method for manufacturing the sputtering target 1 will be described in detail. First, as shown in FIG. 2A, a target material 2 having a Vickers hardness (HV) of 100 or less made of metal is prepared by forming a metal mass, which has been produced by a melt casting method, a spray forming method, a powder metallurgy method, or the like, into a plate shape by a rolling method, a forging method, an extrusion method, or the like. Specifically, the target material 2 having the HV of 100 or less made of metal and the backing plate 6 for fixing the target material 2 are prepared. In the target material 2, its surface serving as the sputtering surface is preferably flat. Machining with a milling cutter, a lathe, or the like, or grinding with a grinding machine is preferable because this process can smooth the surface serving as the sputtering surface without changing the Vickers hardness (HV) of the target material 2. The Vickers hardness (HV) can be confirmed by a Vickers hardness test (JIS Z 2244: 2003).

In the step of preparing the target material 2, a commercially-available target material 2 processed into a predetermined size and having a Vickers hardness (HV) of 100 or less made of metal may be purchased and used. Alternatively, the target material 2 may be reused by taking off the backing plate from the sputtering target whose specifications deviate from product specifications due to the occurrence of abnormality in joint with the backing plate 6 in a manufacturing process of the sputtering target 1 and by further removing a joint material from the sputtering target.

An example of a specific manufacturing method of the target material 2 will be described. The rolling is mentioned in, for example, JP 2010-132942 A and WO 2011/034127; the extrusion is mentioned in, for example, JP 2008-156694 A; and the forging is mentioned in, for example, JP 2017-150015 A and JP 2001-240949 A. Moreover, they are mentioned in Aluminum Technology Handbook (Light Metals Association, Editorial Board of Aluminum Technology Handbook, Kallos Publishing Co., Ltd., New Edition, published on Nov. 18, 1996).

Then, the target material 2 is fixed onto the backing plate 6. Specifically, bonding is performed to join the target material 2 and the backing plate 6. The bonding temperature may vary depending on a bonding method, and the type of materials constituting the target material 2 and the backing plate 6 to be used. However, for example, in the case of bonding (solder bonding) the target material 2 made of high purity Al (purity: 99.99 to 99.999%) and the backing plate 6 made of oxygen-free copper (purity: 99.99%) with a joint material made of indium, tin, or an alloy thereof, the bonding is preferably performed at a temperature of 150° C. or higher and 300° C. or lower. The bonding method can also employ a diffusion bonding method using hot pressing or hot isostatic pressing. When the target material 2 has a disk shape, a support member mainly composed of a ring portion for arranging the target material 2 may be used. The support member preferably has a flange portion for enabling fixing to a sputtering device. The target material 2 can be attached to the ring-shaped support member by Tungsten Inert Gas (TIG) welding or Electron Beam (EB) welding. Also in this welding step, a thick oxidized layer may be formed on the target surface in some cases, and thus polishing may be performed to remove or reduce the oxidized layer.

Then, as shown in FIG. 2B, the multi-stage polishing is performed on the sputtering surface 3 of the target material 2 using a plurality of abrasives having different grit numbers in ascending order of grit number from a small grit number to a large grit number. Specifically, in the case of polishing in two stages, in the first stage of polishing, the abrasive 4 is moved along the long side direction (direction indicated by the arrow A) of the target material 2, while polishing the target material 2. In the second stage of polishing, the polishing is performed in the same way as in the first stage using an abrasive having a larger grit number than a grit number of the abrasive 4 in the first stage. In the case of polishing in three or more stages, the polishing is performed using abrasives such that a grit number of an abrasive in the subsequent stage is larger than a grit number of an abrasive in the previous stage. When polishing the target material along its long side direction, the abrasive 4 may be moved up and down, or left and right, or may be rotated. The polishing direction is not limited to the long side direction, and the polishing may be performed in other directions.

The abrasive is not particularly limited, and an abrasive that includes abrasive grains applied to paper or a fiber base material can be used. However, particularly, an abrasive that includes a nonwoven fabric of synthetic fiber, such as nylon, impregnated with abrasive grains is preferably used. Examples of the abrasive include Scotch-Brite (trade name, manufactured by 3M Japan Limited) and Kenmaron (trade name, manufactured by Sankyo-Rikagaku Co., Ltd.). By using an abrasive that includes an elastic base material in which a nonwoven fabric or the like has a high porosity, scratches can be prevented from occurring due to abrasive grains detached from the abrasive, and the abrasive can be easily applied to a polished surface and can also easily reduce variations in polishing. Abrasive grains are not particularly limited. Any abrasive grain may be selected as long as it has sufficient polishing capability and hardness with respect to the quality of the target material. When the target material is Al or Cu, for example, SiC or alumina may be used as material of the abrasive. It is noted that in the present invention, the correlation between the grain size distribution of abrasive grains of abrasives and the grit numbers (grain sizes) of the abrasives thereof is in conformity with JIS R 6001. The polishing is preferably performed while removing polishing sludge and detached abrasive grains by suction, air exhaust, and air blowing. Thus, the target material 2 can be polished without leaving any polishing sludge and detached abrasive grains on the polished surface, thereby making it possible to prevent the occurrence of deep scratches thereon and the roughening of the polished surface, which can further improve the uniformity of the surface roughness of the sputtering surface 3. The removal of the abrasive sludge and the detached abrasive grains by suction can be carried out in a dust collector or near the dust collector, or by use of a polishing machine equipped with a dust collection mechanism.

It is noted that the polishing can be performed manually or by using a polishing machine equipped with the abrasive. As the polishing machine, an orbital sander is preferably used, but is not limited thereto. Any polishing machine, such as a mini-angle sander, a disk-grinder, or a belt sander, can also be used.

Then, the polished surface obtained after the polishing is cleaned. The cleaning of the surface is preferably performed by air blowing and wiping with alcohol. A solvent used for wiping is not particularly limited, and examples of the solvent suitable for use include organic solvents, such as ethanol, methanol, isopropyl alcohol, acetone, hexane, toluene, xylene, methylene chloride, and ethyl acetate; a commercially available cleaning agent; and the like. In this way, the sputtering target 1 shown in FIG. 1 is manufactured.

It is noted that the manufacturing method of the present invention may include any other step, in addition to the above-mentioned steps. For example, the manufacturing method may include, between the bonding step and the polishing step, an ultrasonic flaw detection (UT detection) step of confirming a bonding rate between the target material 2 and the backing plate 6, a polishing step of the backing plate 6, and the like.

According to the above-mentioned manufacturing method, the multi-stage polishing is performed on the sputtering surface 3 of the target material 2, which does not have a sufficiently high hardness (having a Vickers hardness (HV) of 100 or less), by use of the plurality of abrasives having the different grit numbers in ascending order of grit number from the small grit number to the large grit number. Thus, the oxidized layer can be removed or reduced from the surface of the target material 2 in a short time by the abrasive having the small grit number, and thereafter the surface irregularities on the surface of the target material 2 can be reduced by the abrasives along with the increase in grit number of the abrasive, whereby the sputtering target 1 that is less likely to cause abnormal discharge can be obtained.

Meanwhile, in a case where the target material 2 that does not have a sufficient hardness (having a Vickers hardness (HV) of 100 or less) is polished in a single stage, it is very difficult to find a grit number at which the above-mentioned effect can be obtained for each of the target materials 2 having various hardness. At this time, if a grain size of the abrasive having the grit number is excessively coarse (the grit number is excessively small), the oxidized layer can be removed or reduced, but surface irregularities that would cause abnormal discharge are generated on the target material 2. This is considered to be because the target material 2 is so soft that a rough grain of the abrasive is easily transferred to the surface of the target material 2. If a grain size of the abrasive having the grit number is excessively fine (the grit number is excessively large), it takes a very long time to perform polishing in order to obtain a predetermined surface state.

The multi-stage polishing is preferably performed such that in two sequential stages, a grit number of an abrasive used in the latter stage is more than 1.0 time (preferably 1.3 times) and less than 2.5 times (preferably 2.1 times) larger than a grit number of an abrasive used in the former stage. In the two sequential stages, by using the abrasives having such grit numbers, the polishing in the latter stage uses the abrasive of abrasive grains whose size is not coarse and finer than the grain size of the abrasive used in the former stage. Consequently, scratches generated by the abrasive having the previous grit number can be significantly reduced by the abrasive having the next grit number, thereby making it possible to reduce the surface irregularities on the sputtering surface 3.

The multi-stage polishing is preferably performed such that a grit number of the abrasive used in the last stage is 1.7 times or less and preferably 1.6 times or less larger than a grit number of the abrasive used in a stage immediately preceding the last stage. By using the abrasives having such grit numbers, scratches generated by the abrasive that is used in the stage immediately preceding the last stage can be significantly reduced in the last stage, thereby making it possible to reduce surface irregularities on the sputtering surface 3.

In the multi-stage polishing, the grit number of the abrasive used in the first stage can be normally #100 or more, preferably #280 or more, more preferably #320 or more and #1200 or less, still more preferably #360 or more and #800 or less, and yet more preferably #500 or more and #700 or more. The grit number of the abrasive used in the first stage is set at more than #320, thus making it possible to prevent the sputtering surface 3 of the target material 2 from being scratched to an extent that a scratch cannot be recovered in the subsequent stage.

In the multi-stage polishing, the grit number of the abrasive used in the last stage is preferably #800 or more and #1500 or less. Since the grit number of the abrasive used in the last stage is set at #800 or more and #1500 or less, finish polishing is performed by the abrasive having a sufficiently fine grain size. Thus, the surface irregularities on the sputter surface 3 of the target material 2 can be sufficiently reduced to the extent that the occurrence of abnormal discharge is effectively reduced, thereby making it possible to manufacture the sputtering target 1 which is less likely to cause abnormal discharge during sputtering.

The polishing time in each stage only needs to be sufficient to polish the entire sputtering surface 3 and is not particularly limited, but the polishing is preferably performed until the polished surface appears uniform. When the target material 2 is made of aluminum, preferably the polishing is performed, for example, at 50 s/m$^2$ or more, and preferably 100 s/m$^2$ or more.

To evaluate the sputtering target 1 manufactured in the above-mentioned steps, the sputtering surface 3 of the manufactured sputtering target 1 is imaginarily divided for convenience. For example, in a case where the sputtering surface 3 of the target material 2 is rectangular, the division is performed so as to imaginarily divide the sputtering surface 3 of the target material 2 equally into a plurality of regions at least in the long side direction of the target material 2. When the sputtering surface 3 of the target material 2 is imaginarily divided into three regions, for example, as shown in FIG. 3, the areas of regions S1, S2, and S3 indicated by hatched parts become substantially equal. The evaluation of the sputtering target 1 is performed by measuring the arithmetic average roughness Ra, which is a measure of the roughness of the surface of each region divided imaginarily as mentioned above, for example, with a contact surface roughness tester, and then calculating an average value and standard deviation σ of the plurality of measured arithmetic average roughness Ra. The measurement of the surface roughness is preferably performed at the center of each of the divided regions. The arithmetic average roughness Ra as used in the present specification is a value determined by obtaining a measurement curve using the contact surface roughness tester, subtracting an average height at all points on the measurement curve from a height at each arbitrary point on the measurement curve, and summing and averaging absolute values of the values (deviations Yi) obtained through the subtraction. Thus, the arithmetic average roughness Ra is represented by the following equation.

$$R_a = \frac{1}{N}\sum_{i=1}^{N}|Y_i| \quad (1)$$

In the sputtering target 1 manufactured by the above-mentioned method and shown in FIG. 1, the average of the plurality of arithmetic average roughness Ra of the sputtering surface 3 (measured at about 3 to 6 points in the plane thereof) is 0.8 μm or less, preferably 0.6 μm or less, and more preferably 0.5 μm or less. The lower limit value of the average of the arithmetic average roughness Ra is not particularly limited, but is preferably 0.01 μm or more, more preferably 0.05 μm or more, still more preferably 0.08 μm or more, and yet more preferably 0.1 μm or more. When the average of the plurality of arithmetic average roughness Ra of the sputtering surface 3 is equal to or more than the above-mentioned lower limit, irregularities made by fine mechanical processing marks (polishing marks) remain on the sputtering surface 3 of the sputtering target 1, so that the sputtering in an initial stage is easily stabilized. The standard deviation σ of the plurality of arithmetic average roughness Ra is 0.2 μm or less, preferably 0.15 μm or less, more preferably 0.1 μm or less, and still more preferably 0.08 μm or less. Furthermore, the ratio thereof to the average value of the arithmetic average roughness Ra (the standard deviation σ of the plurality of arithmetic average roughness Ra/the average value of the plurality of arithmetic average roughness Ra) is preferably 0.3 or less, more preferably 0.2 or less, and still more preferably 0.15 or less. A specific method of polishing is performed to set the average of the arithmetic average roughness Ra, the standard deviation σ thereof, and the standard deviation σ of Ra/the average value of Ra of the manufactured sputtering target 1 within the respective preferable ranges (average of the arithmetic average roughness Ra: 0.5 μm or less, the standard deviation o: 0.1 μm or less, and the standard deviation σ of Ra/average value of Ra: 0.2 or less). In the specific method, the polishing is performed such that in two sequential stages, a grit number of the abrasive used in the latter stage is more than 1.0 time and less than 2.5 times larger than a grit number of the abrasive used in the former stage. Here, the grit number of the abrasive used in the first stage is #400 or more. The grit number of the abrasive used in the last stage is #800 or more and #1500 or less. The grit number of the abrasive used in the last stage is 1.5 times or less larger than a grit number of the abrasive used in a stage immediately preceding the last stage. In the sputtering target 1 obtained in this way, the average of the plurality of arithmetic average roughness Ra of the sputtering surface 3 is sufficiently small, namely, 0.5 μm or less even after joining the target material with the backing plate and/or support member. Thus, surface irregularities on the sputtering surface are reduced, making it less likely to cause abnormal discharge. In addition, the standard deviation σ of the plurality of arithmetic average roughness Ra of the sputtering surface 3 is sufficiently small, namely, 0.1 μm or less, and the standard deviation σ of Ra/average value of Ra is also sufficiently small, namely, 0.2 or less, thus making the state of the sputtering surface 3 uniform. This rarely causes local electrical charging, so that abnormal discharge is less likely to occur. Furthermore, the occurrence of hard arc in the initial stage of sputtering can also be effectively suppressed.

In the sputtering target 1 manufactured by the above-mentioned method and shown in FIG. 1, the Vickers hardness of the metal, which is the material of the target material 2, is not particularly limited as long as it is 100 or less. For example, the hardness of Cu (oxygen-free copper) may be 90 or less, the hardness of an Al-0.5 wt % Cu alloy may be 30 or less, or the hardness of pure Al may be 20 or less.

The material of the target material 2 is not particularly limited as long as it has the above-mentioned HV. For example, Al, Cu, a metal containing these metals, or the like can be used in the target material 2. From the viewpoint of exhibiting the effects of the present application, the Vickers hardness of the target material 2 is preferably 95 or less, more preferably 60 or less, still more preferably 50 or less, yet more preferably 40 or less, and particularly preferably 30 or less. Metal that has a higher hardness than the target material 2 is preferably used in the backing plate 6. For example, Cu, a Cu alloy, an Al alloy, Ti, or the like can be used in the backing plate 6.

While the planer sputtering target has been described above, a cylindrical sputtering target that is less likely to cause abnormal discharge in sputtering can also be manufactured in the same manner. A method for manufacturing a cylindrical sputtering target according to an embodiment of the present invention will be described below.

A cylindrical target material having a Vickers hardness (HV) of 100 or less made of metal is prepared. The cylindrical target material can be formed by an extrusion method or the like from a metal mass, which has been produced by a melt casting method, a spray forming method, a powder metallurgy method, or the like. In the target material, its outer peripheral surface serving as the sputtering surface preferably has no distortion. Machining with a lathe or grinding with a grinding machine is preferable because this process can remove distortion from the outer peripheral surface as the sputtering surface without changing the Vickers hardness (HV) of the target material. In the case of a sputtering target using a backing tube, the target material is bonded to the backing tube. The bonding temperature may vary depending on a bonding method, a target material used, and the type of a material constituting the backing tube. For example, when the target material made of high-purity Al (having a purity of 99.99 to 99.999%) and the backing tube made of SUS304 are bonded (solder-bonded) together with a joint material made of indium, tin, or an alloy thereof, the bonding is preferably performed at a temperature of 150° C. or higher and 300° C. or lower.

In the step of preparing the cylindrical target material, a commercially-available cylindrical target material processed into a predetermined size and having a Vickers hardness (HV) of 100 made of metal or less may be purchased and used. Alternatively, the cylindrical target material may be reused by taking off the backing plate from the cylindrical sputtering target whose specifications deviate from product specifications due to the occurrence of abnormality in joint with the backing plate in a manufacturing process of the cylindrical sputtering target and by further removing a joint material from the cylindrical sputtering target.

An example of a specific manufacturing method of the cylindrical target material will be described. The extrusion method is mentioned in, for example, JP 2013-185238 A and JP 2009-90367 A. Moreover, it is mentioned in Aluminum Technology Handbook (Light Metals Association, Editorial Board of Aluminum Technology Handbook, Kallos Publishing Co., Ltd., New Edition, published on Nov. 18, 1996).

In the case of a sputtering target to which a flange or cap material is attached, the cap or flange is attached to each of both ends of the target material by Tungsten Inert Gas welding (TIG welding) or Electron Beam welding (EB welding). Also in this welding step, a thick oxidized layer may be formed on the target surface in some cases, and thus polishing may be performed to remove or reduce the oxidized layer.

The polishing step, the cleaning step of the surface after the polishing, and other arbitrary steps can be performed in the same manner as in the case of the planar target. In the polishing step, an abrasive that includes abrasive grains applied to a paper or a fiber base material is used, and the polishing can be performed manually or by using a polishing machine in the same manner as the planar target. The multi-stage polishing is performed on the sputtering surface of the target material using a plurality of abrasives having different grit numbers in ascending order of grit number from a small grit number to a large grit number. Specifically, the abrasive is moved along the axial direction of the cylindrical target material 2, while polishing the target material. At this time, the abrasive may be moved while rotating the target material, or alternatively, the abrasive may be moved while fixing the target material. During the polishing, the axial direction of the target material may be horizontal or vertical relative to the ground surface. Alternatively, the axial direction of the target material may be inclined with an angle at which the polishing is easily performed. In the second stage of polishing, the polishing is performed in the same way as in the first stage by using the abrasive having a larger grit number than the grit number of the abrasive in the first stage. In the case of polishing in three or more stages, the polishing is performed using abrasives such that the grit number of the abrasive in the subsequent stage is larger than the grit number of the abrasive in the previous stage. When polishing the target material along its long side direction, the abrasive may be moved up and down, or left and right, or may be rotated. The polishing direction is not limited to the axial direction, and thus the polishing may be performed in other directions.

Like the planar target, the surface roughness of the cylindrical sputtering target manufactured in the above-mentioned steps is preferably evaluated by imaginarily dividing the sputtering surface in the longitudinal direction of the target material into a plurality of regions for convenience and then measuring the surface roughness at the center of each of the divided regions. In the cylindrical sputtering target manufactured by the above-mentioned method, the average of the plurality of arithmetic average roughness Ra of the sputtering surface (measured at about 3 to 6 points in the plane thereof) is 0.8 μm or less, preferably 0.6 μm or less, and more preferably 0.5 μm or less. The lower limit value of the average of the arithmetic average roughness Ra is not particularly limited, but is preferably 0.01 μm or more, more preferably 0.05 μm or more, still more preferably 0.08 μm or more, and particularly preferably 0.1 μm or more. When the average of the plurality of arithmetic average roughness Ra of the sputtering surface 3 is equal to or more than the above-mentioned lower limit, irregularities made by fine mechanical processing marks (polishing marks) remain on the sputtering surface 3 of the sputtering target 1, so that the sputtering in the initial stage is easily stabilized. The standard deviation σ of the plurality of arithmetic average roughness Ra is 0.2 μm or less, preferably 0.15 μm or less, more preferably 0.1 μm or less, and still more preferably 0.08 μm or less. The ratio of the standard deviation of the plurality of arithmetic average roughness Ra to average value of Ra (the standard deviation σ of Ra/average value of Ra) is 0.3 or less, preferably 0.2 or less, and more preferably 0.15 or less. A specific method is performed to set the average of the arithmetic average roughness Ra and the standard deviation σ of the manufactured cylindrical sputtering target within the respective preferable ranges (average of the arithmetic average roughness Ra: 0.5 μm or less, the standard deviation σ: 0.1 μm or less, the standard deviation σ of Ra/average value of Ra: 0.2 or less). In the specific method, the polishing is preferably performed such that in two sequential stages, a grit number of the abrasive used in the latter stage is more than 1.0 time and less than 2.5 times larger than a grit number of the abrasive used in the former stage. The grit number of the abrasive used in the first stage is preferably more than #320. The grit number of the abrasive used in the last stage is preferably #800 or more and #1500 or less. The grit number of the abrasive used in the last stage is 1.7 times or less larger than the grit number of the abrasive used in a stage immediately preceding the last stage. In the sputtering target 1 obtained in this way, the average of the plurality of arithmetic average roughness Ra of the sputtering surface 3 is sufficiently small, namely, 0.5 μm or less even after joining the target material with the backing tube, flange, or cap material. Thus, surface irregularities on the sputtering surface are the standard deviation σ of the plurality of arithmetic average roughness Ra of the sputtering surface 3 is sufficiently small, namely, 0.1 μm or less, and the standard deviation σ of Ra/average value of Ra is also sufficiently small, namely, 0.2 μm or less, thus making the state of the sputtering surface 3 uniform. This rarely causes local electrical charging, so that abnormal discharge is less likely to occur.

EXAMPLES 1 TO 7

A rolled plate made of high-purity Al with a purity of 99.999% that had a Vickers hardness of 16 was prepared and then subjected to a cutting process by a gate type machining center, thereby producing a target material 2 having a size of 300 mm×350 mm×t16 mm. Regarding the Vickers hardness, a measurement sample having a size of 50 mm×50 mm×t16 mm was fabricated from the rolled plate made of high-purity Al, which was the same as the target material 2, and then the Vickers hardness of the sample was measured by indenting the sample under the conditions including a test force of 9.807N and a test-force holding time of 15 s, using a micro hardness tester HMV-2TADW (trade name) manufactured by Shimadzu Corporation, and based on JIS Z2244:2003. The sputtering surface of the target material 2 was milled so as to be a flat surface. As shown in FIG. 3, a sputtering surface 3 was imaginarily divided into three regions for convenience, and then the arithmetic average roughness Ra at the center of each region was measured based on JIS B0601 2001 by using a portable surface roughness measurement tester Surftest SJ-301 (trade name) manufactured by Mitsutoyo Corporation. Consequently, an average value of a plurality of arithmetic average roughness Ra of the regions in the sputtering surface 3 was 0.32 μm. The target material 2 obtained after the cutting process and a backing plate 6 composed of oxygen-free copper having a purity of 99.99% were solder-bonded at 200° C. to form a sputtering target 1. After the UT inspection was performed on the formed sputtering target 1, the backing plate 6 was polished by Kenmaron.

Then, the multi-stage polishing was performed on the sputtering surface 3 of the target material 2 using a plurality of abrasives having different grit numbers in ascending order of grit number from a small grit number to a large grit number. Specifically, the polishing was performed on the sputtering surface 3 of the target material 2 using an orbital sanders (SV12SG(trade name) manufactured by Hitachi Koki Co., Ltd.) which was equipped with an appropriate one of abrasives Kenmaron (trade name, manufactured by Sankyo-Rikagaku Co., Ltd.) having various grit numbers (grain sizes), while moving and pressing the swinging abrasive against the sputtering surface 3. At this time, the polishing was performed in a dust collector while removing polishing sludge. In each stage, the polishing was performed until the polished sputtering surface appeared uniform. After the polishing, the sputtering surface 3 of the target material 2 was air-blown and wiped with ethanol. Subsequently, similarly to before the polishing, the sputtering surface 3 was imaginarily divided into three regions for convenience, and the parameter of the arithmetic average roughness Ra was measured at the center of each region, whereby the average value and standard deviation σ of the plurality of arithmetic average roughness of the sputtering surface 3 were calculated. Table 1 below shows the grit number of the abrasive used in each of the plurality of stages of polishing, the calculated average value and standard deviation σ of the plurality of arithmetic average roughness Ra, the standard deviation σ of Ra/average value of Ra, a difference between a maximum value and a minimum value of Ra, and the difference between the maximum value and the minimum value of Ra/average value of Ra.

TABLE 1

| | | Polishing conditions | | | | Ra/μm | | | | |
| | | | | | | | | Standard deviation/ | | (Max-Min)/ |
| | Target material | First stage | Second stage | Third stage | Fourth stage | Average value | Standard deviation | Average value | Max-Min | Average value |
|---|---|---|---|---|---|---|---|---|---|---|
| Example 1 | High-purity Al | #400 | #800 | #1200 | | 0.44 | 0.04 | 0.09 | 0.08 | 0.18 |
| Example 2 | High-purity Al | #400 | #800 | #1200 | | 0.45 | 0.07 | 0.16 | 0.1 | 0.22 |
| Example 3 | High-purity Al | #600 | #800 | #1200 | | 0.33 | 0.06 | 0.18 | 0.14 | 0.42 |
| Example 4 | High-purity Al | #800 | #1500 | | | 0.55 | 0.09 | 0.16 | 0.17 | 0.31 |
| Example 5 | High-purity Al | #320 | #800 | #1500 | | 0.69 | 0.11 | 0.16 | 0.21 | 0.30 |
| Example 6 | High-purity Al | #320 | #800 | #1500 | #3000 | 0.61 | 0.09 | 0.15 | 0.16 | 0.26 |
| Example 7 | High-purity Al | #320 | #800 | | | 0.75 | 0.17 | 0.23 | 0.68 | 0.91 |
| Example 8 | High-purity Al | #400 | #800 | #1200 | | 0.49 | 0.05 | 0.10 | 0.16 | 0.33 |
| Example 9 | High-purity Al | #400 | #800 | #1200 | | 0.47 | 0.05 | 0.11 | 0.17 | 0.36 |
| Example 10 | High-purity Cu | #400 | #800 | #1200 | | 0.12 | 0.01 | 0.08 | 0.01 | 0.08 |
| Comparative Example 1 | High-purity Al | #180 | | | | 0.97 | 0.16 | 0.16 | 0.48 | 0.49 |

As shown in Table 1, the multi-stage polishing was performed on the sputtering target 1 obtained in the above-mentioned steps, thereby making it possible to provide the sputtering target 1 in which an average value of the plurality of arithmetic average roughness Ra was less than 0.8 μm and that was less likely to cause abnormal discharge. The grit number of the abrasive used in the first stage was set at more than #320, thus providing a good sputtering surface 3 in which an average value of the plurality of arithmetic average roughness Ra was less than 0.6 μm. In two sequential stages, the grit number of the abrasive used in the latter stage was set at less than 2.5 times larger than the grit number of the abrasive used in the former stage, so that scratches generated in the former stage could be significantly reduced in the latter stage. Thus, the average value of the plurality of arithmetic average roughness Ra could be 0.6 μm or less, the standard deviation σ thereof could be effectively reduced, and a difference between the maximum and the minimum of Ra could be suppressed to 0.50 μm or less. In the multi-stage polishing, the grit number of the abrasive used in the last stage was set at 1.7 times or less larger than the grit number of the abrasive used in a stage immediately preceding the last stage, thereby providing the good sputtering surface 3 with less surface irregularities and variations thereof. Specifically, regarding the surface irregularities, an average of the plurality of arithmetic average roughness Ra was 0.5 μm or less, the standard deviation σ thereof was 0.1 μm or less (standard deviation σ of Ra/average value of Ra was 0.2 or less), and the difference between the maximum value and the minimum value of Ra was 0.20 μm or less (the difference between the maximum value and the minimum value/average value of Ra was 0.4 or less).

EXAMPLES 8 AND 9

Furthermore, a rolled plate made of high-purity Al with a purity of 99.999% that had a Vickers hardness of 16 was prepared and then subjected to a cutting process by the gate type machining center, thereby producing a target material 2 having a size of 950 mm×1,000 mm×t16 mm. The Vickers hardness was measured in the same manner as in Examples 1 to 7. The sputtering surface of the target material 2 was milled so as to be a flat surface. The sputtering surface 3 was imaginarily divided into 16 regions for convenience, and then the arithmetic average roughness Ra at the center of each region was measured based on JIS B0601 2001 by using a portable surface roughness measurement tester Surftest SJ-301 (trade name) manufactured by Mitsutoyo Corporation. Consequently, an average value of a plurality of arithmetic average roughness Ra of the regions in the sputtering surface 3 was 0.35 μm. The target material 2 obtained after the cutting process and a backing plate 6 composed of oxygen-free copper having a purity of 99.99% were solder-bonded at 200° C. to form a sputtering target 1. After the UT inspection was performed on the formed sputtering target 1, the backing plate 6 was polished by Kenmaron.

Then, the multi-stage polishing was performed on the sputtering surface 3 of the target material 2 under the same conditions as in Example 1. Subsequently, similarly to before the polishing, by imaginarily dividing the sputtering surface 3 into 16 regions for convenience, the average value of a plurality of the arithmetic average roughness Ra of the sputtering surface 3 and the standard deviation σ thereof were calculated. Table 1 also shows the calculated average value and the standard deviation σ of the plurality of arithmetic average roughness Ra, the standard deviation σ of Ra/average value of Ra, a difference between a maximum value and a minimum value of Ra, and the difference between the maximum value and the minimum value of Ra/average value of Ra.

The results of Examples 8 and 9 revealed that the polishing method of the present invention was also suitable for polishing a large-sized target material.

EXAMPLE 10

A rolled plate made of oxygen-free copper with a purity of 99.99% that had a Vickers hardness of 88 was prepared and then subjected to a cutting process by the gate type machining center, thereby producing a target material 2 having a size of 300 mm×350 mm×t16 mm. Regarding the Vickers hardness, a measurement sample having a size of 50 mm×50 mm×t16 mm was fabricated from the rolled plate made of oxygen-free copper, which was the same as the target material 2, and then the Vickers hardness of the sample was measured by indenting the sample under the conditions, such as a test force of 20 kgf and a test-force holding time of 15 s, using a Vickers hardness tester AVK-A (trade name) manufactured by Akashi Seisakusho, Ltd. and based on JIS Z2244:2003. The sputtering surface of the target material 2 was milled so as to be a flat surface. The sputtering surface 3 was imaginarily divided into three regions for convenience, and then the arithmetic average roughness Ra at the center of each region was measured based on JIS B0601 2001 by using a portable surface roughness measurement tester Surftest SJ-301 (trade name) manufactured by Mitsutoyo Corporation. Consequently, an average value of a plurality of arithmetic average roughness Ra of the regions in the sputtering surface 3 was 0.29 μm. The target material 2 obtained after the cutting process and a backing plate 6 composed of oxygen-free copper having a purity of 99.99% were solder-bonded at 200° C. to form a sputtering target 1. After the UT inspection was performed on the formed sputtering target 1, the backing plate 6 was polished by Kenmaron.

Then, the multi-stage polishing was performed on the sputtering surface 3 of the target material 2 under the same conditions as in Example 1. Subsequently, similarly to before the polishing, by imaginarily dividing the sputtering surface 3 into three regions for convenience, the average value of a plurality of the arithmetic average roughness Ra of the sputtering surface 3 and the standard deviation σ thereof were calculated. Table 1 mentioned above shows the calculated average value and standard deviation σ of the plurality of arithmetic average roughness Ra, the standard deviation σ of Ra/average value of Ra, a difference between a maximum value and a minimum value of Ra, and the difference between the maximum value and the minimum value of Ra/average value of Ra.

Although in the above-mentioned example, a planar target material was formed and evaluated, the same process can be applied to a cylindrical target material as well, thereby obtaining the same effects.

COMPARATIVE EXAMPLE

A rolled plate made of high-purity Al with a purity of 99.999% that had a Vickers hardness of 16 was prepared and then subjected to a cutting process by a gate type machining center, thereby producing a target material 2 having a size of 300 mm×350 mm×t16 mm. The Vickers hardness was measured in the same manner as in Examples 1 to 7. The sputtering surface of the target material 2 was milled so as to be a flat surface. The sputtering surface 3 was imaginarily divided into three regions for convenience, and then the arithmetic average roughness Ra at the center of each region was measured based on JIS B0601 2001 by using a portable surface roughness measurement tester Surftest SJ-301 (trade name) manufactured by Mitsutoyo Corporation. Consequently, an average value of a plurality of arithmetic average roughness Ra of the regions in the sputtering surface 3 was 0.42 μm. The target material 2 obtained after the cutting process and a backing plate 6 composed of oxygen-free copper having a purity of 99.99% were solder-bonded at 200° C. to form a sputtering target 1. After the UT inspection was performed on the formed sputtering target 1, the backing plate 6 was polished by Kenmaron.

Then, single-stage polishing was performed on the sputtering surface 3 of the target material 2 on a condition where the grit number of an abrasive was #180. The polishing was performed until the sputtering surface appeared uniform. Subsequently, similarly to before the polishing, by imaginarily dividing the sputtering surface 3 into three regions for convenience, the average value of a plurality of the arithmetic average roughness Ra of the sputtering surface 3 and the standard deviation σ thereof were calculated. Table 1 also shows the calculated average value and standard deviation σ of the plurality of arithmetic average roughness Ra, the standard deviation σ of Ra/average value of Ra, a difference between a maximum value and a minimum value of Ra, and the difference between the maximum value and the minimum value of Ra/average value of Ra.

In Examples 1 to 10, the polishing could achieve the state in which the average value of the arithmetic average roughness Ra was low, whereas in Comparative Example 1, the polishing led to a significant increase in the average value of the arithmetic average roughness Ra. This is considered to be because the multi-stage polishing was not performed in Comparative Example 1, thus failing to effectively reduce surface irregularities.

DESCRIPTION OF REFERENCE NUMERALS

1 Sputtering target
2 Target material
3 Sputtering surface
4 Abrasive
6 Backing plate

The invention claimed is:

1. A sputtering target comprising a target material made of metal having a Vickers hardness of 100 or less, wherein an average of arithmetic average roughness Ra measured at a plurality of measurement points on a sputtering surface of the target material is 0.5 μm or less, a standard deviation of the arithmetic average roughness Ra measured at the plurality of measurement points thereon is 0.1 μm or less, and the difference between the maximum value and the minimum value of the arithmetic average roughness Ra measured at the plurality of measurement points thereon/the average of arithmetic average roughness Ra measured at a plurality of measurement points thereon is 0.22 or less.

2. The sputtering target according to claim 1, wherein the target material has a length of 1,000 mm to 3,500 mm in a long side direction.

3. The sputtering target according to claim 1, wherein the Vickers hardness is 40 or less.

4. The sputtering target according to claim 1, wherein the target material made of metal is Al, Al alloy, Cu or Cu alloy.

5. The sputtering target according to claim 1, wherein the target material having been bonded to a backing plate.

6. A method for manufacturing a sputtering target, which comprises performing multi-stage polishing on a sputtering surface of a target material having a Vickers hardness of 100 or less made of metal, the target material having been bonded to a backing plate, by using a plurality of abrasives having different grit numbers in ascending order of grit number from a small grit number to a large grit number, wherein the abrasive used in a last stage of the multi-stage polishing is 1.6 times or less larger than a grit number of an abrasive used in a stage immediately preceding the last stage, and wherein the abrasive includes a nonwoven fabric of synthetic fiber impregnated with abrasive grains, wherein an orbital sander equipped with the abrasive is used.

* * * * *